United States Patent [19]
Galbraith

[11] Patent Number: 5,196,849
[45] Date of Patent: Mar. 23, 1993

[54] METHOD AND APPARATUS FOR IMPLEMENTING PRML CODES WITH MAXIMUM ONES

[75] Inventor: Richard L. Galbraith, Rochester, Minn.

[73] Assignee: International Business Machines Corporation, Armonk, N.Y.

[21] Appl. No.: 829,796

[22] Filed: Jan. 31, 1992

[51] Int. Cl.⁵ ............................................. H03M 7/46
[52] U.S. Cl. ........................................ 341/59; 375/18
[58] Field of Search ................. 341/59, 50, 58, 119, 341/133, 135, 136; 371/95, 43, 44, 55; 375/18, 34

[56] References Cited

U.S. PATENT DOCUMENTS 4,539,681  9/1985  Ogawa et al. .
4,677,421  6/1987  Taniyama .
4,707,681  11/1987  Eggenberger et al. .
4,775,985  10/1988  Busby .
4,786,890  11/1988  Marcus et al. .
4,833,470  5/1989  Iketani .
4,888,779  12/1989  Karabed et al. .
4,945,538  7/1990  Patel .

Primary Examiner—A. D. Pellinen
Assistant Examiner—Brian K. Young
Attorney, Agent, or Firm—Joan Pennington; Richard E. Billion; Bradley A. Forrest

[57] ABSTRACT

Apparatus and methods are provided for encoding a predefined number of bits of binary data into codewords having a predefined number of bits for a partial-response maximum-liklihood (PRML) data channel in a direct access storage device (DASD). Rate 8/9 block codes having maximum ones and run length constraints $(0,8,12,\infty)$ and $(0,8,6,\infty)$ provide timing and gain control and reduced susceptibility to misequalization effects in PRML channels.

16 Claims, 6 Drawing Sheets

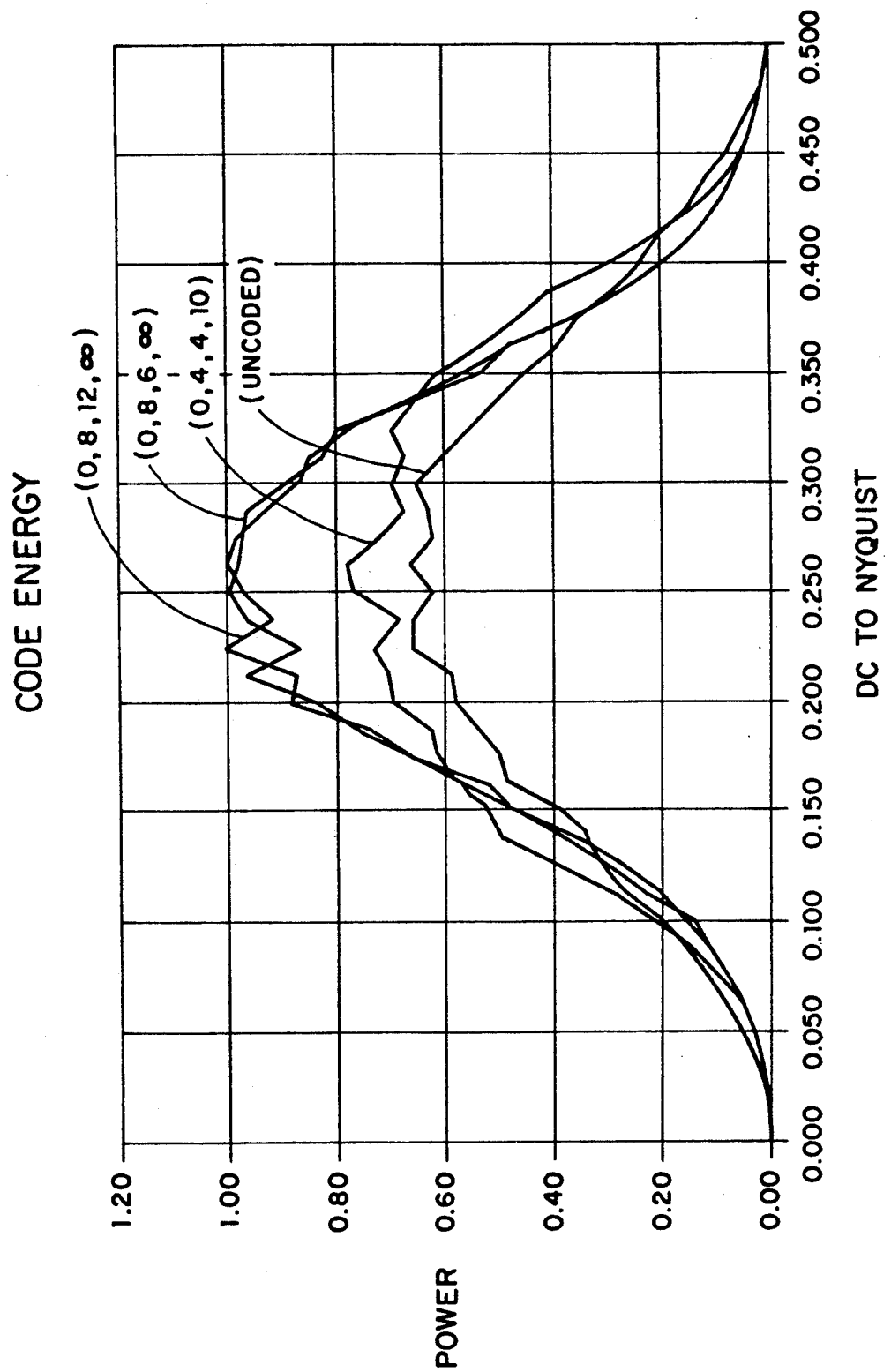

METHOD AND APPARATUS FOR IMPLEMENTING PRML CODES WITH MAXIMUM ONES

BACKGROUND OF THE INVENTION

1. Field of the Invention

The invention relates generally to encoding data, and more particularly to data encoding methods and apparatus for a partial-response maximum-likelihood (PRML) data channel in a direct access storage device (DASD).

2. Description of the Prior Art

Computers often include auxiliary memory storage units having media on which data can be written and from which data can be read for later use. Disk drive units incorporating stacked, commonly rotated rigid magnetic disks are used for storage of data in magnetic form on the disk surfaces. Data is recorded in concentric, radially spaced data information tracks arrayed on the surfaces of the disks. Transducer heads driven in a path toward and away from the drive axis write data to the disks and read data from the disks. Partial-response signaling with maximum-likelihood sequence detection techniques are known for digital data communication and recording applications. Achievement of high data density and high data rates has resulted in the use of a PRML channel for writing and reading digital data on the disks.

Uncoded binary data is not suitable for use in PRML data channels because unconstrained customer data may contain long spans of null signal or adjacent zeroes which provides no timing or gain information to the channel and prevent proper timing and gain tracking to the read back signal waveform. Rate 8/9 modulation codes are known for use with PRML channels to assure a minimum correction rate for the PRML timing and gain control loops.

U.S. Pat. No. 4,786,890 discloses a class-IV PRML channel using a run-length limited (RLL) rate 8/9 code. The disclosed class-IV partial response channel polynomial equals $(1-D^2)$, where D is a delay operator and $D^2$ is a delay of 2 bit times and the channel response output waveform is described by taking the input waveform and subtracting from it the same waveform delayed by a 2 bit interval. A $(d=0, k=3/k1=5)$ PRML modulation code is utilized to encode 8 bit binary data into codewords comprised of 9 bit code sequences, the maximum number k of consecutive zeroes allowed within a code sequence is 3 and the maximum number k1 of consecutive zeroes in the all-even or all-odd subsequences is 5. A minimum number d of consecutive zeroes greater than zero is not needed because in PRML channels compensation for intersymbol interferences (ISI) is inherent in the ML detector.

U.S. Pat. No. 4,707,681 discloses rate 8/9 RLL block codes having (0,4/4) and (0, 3/6) constraints.

Disadvantages of known codes relate to timing and gain control and susceptibility to misequalization effects in PRML channels for at least some of the codewords in the codes.

SUMMARY OF THE INVENTION

Important objects of the present invention are to provide improved methods for coding data input strings at high rate to improve the timing corrections and to reduce sensitivities to misequalization of partial response channels; to provide encoder and decoder structure that can be effectively and efficiently configured for transmission of digital data over PRML channels; to provide encoder and decoder structure that reduces and simplifies hardware requirements and to provide such improved coding methods and encoder and decoder structure that overcomes many of the disadvantages of prior art arrangements.

In brief, the objects and advantages of the present invention are achieved by apparatus and a method for encoding a predefined number of bits of binary data into codewords having a predefined number of bits for a partial-response maximum-likelihood (PRML) data channel in a direct access storage device (DASD). The binary data is received and sequences of codewords are generated responsive to the received binary data. Each of the generated codewords is included in a predetermined set of codewords. The codeword set has a maximum number of binary ones. The generated sequences of have less than a first predetermined number of consecutive zeroes and include two subsequences, one of the subsequences including odd bit positions and another of the subsequences including even bit positions. Each of the subsequences has less than a second predetermined number of consecutive zeroes.

Objects of the invention are achieved by rate 8/9 block codes having maximum ones and run length constraints $(0,8,12,\infty)$ and $(0,8,6,\infty)$ that provide timing and gain control and reduced susceptibility to misequalization effects in PRML channels.

BRIEF DESCRIPTION OF THE DRAWING

The present invention together with the above and other objects and advantages may best be understood from the following detailed description of the embodiment of the invention illustrated in the drawings, wherein:

FIG. 6 is a chart illustrating power spectrums for the rate 8/9 $(0,8,12,\infty)$ and rate 8/9 $(0,8,6,\infty)$ codes in accordance with the invention relative to a rate 8/9 (4,4,10) code and uncoded data.

DETAILED DESCRIPTION OF THE PREFERRED EMBODIMENT

Figure 1:
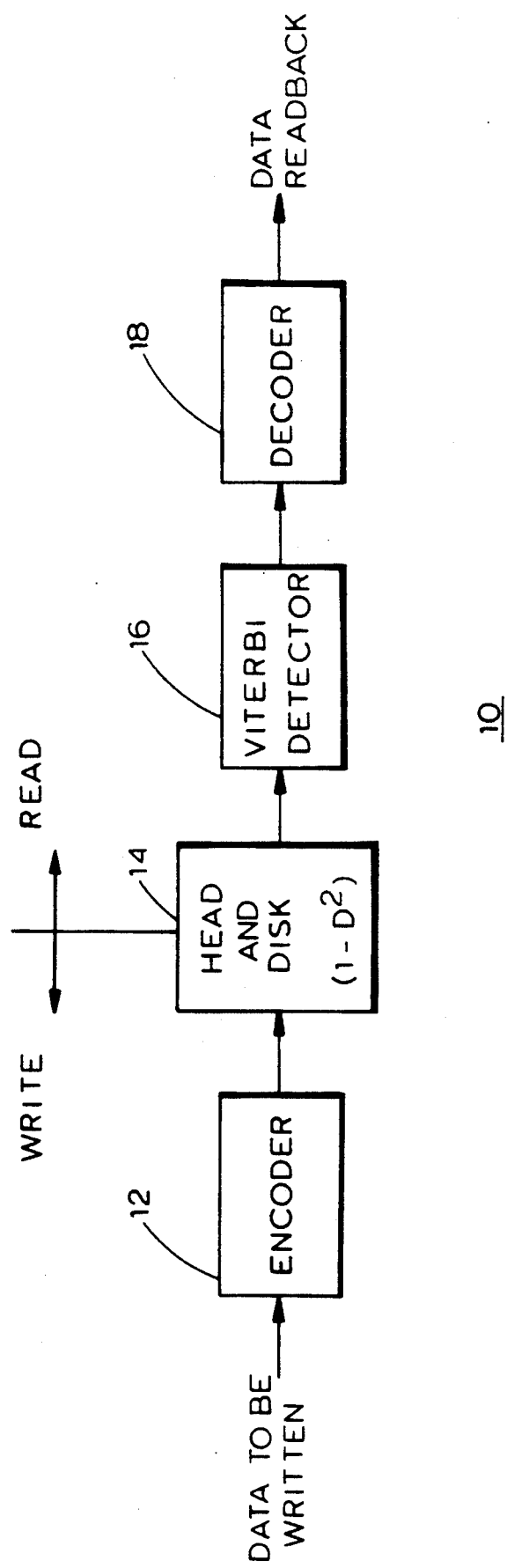
FIG. 1 is a block diagram representation of a PRML channel.

Referring now to FIG. i, there is shown a block diagram of a partial-response maximum-likelihood (PRML) recording channel 10 in a direct access storage device for carrying out the coding methods of the invention. Data to be written is applied to an encoder 12. Encoder 12 produces coded data or codewords which serve as an input to a class-IV partial-response (PR) channel 14 described by a $(1-D^2)$ operation. A channel output is generated by the channel 14 and detected at the channel output by a Viterbi detector 16 coupled to a decoder 18 to complete the maximum-likelihood (ML) detection process for data readback.

The PR class-IV channel transfer function $(1-D^2)$ is equivalent to two independent interleaved dicode channels each displaying a transfer function described by $(1-D)$ where D represents one interleaved sample delay. Customer data input stream is applied to the encoder 12 and encoded. Odd and even sequences of channel output are detected by Viterbi detector 16 and applied to the decoder 18. The decoder 18 then generates the channel input data.

Rate 8/9 block codes particularly suitable for magnetic recording are provided for use in the PRML channel 10. With the rate 8/9 code, a 9-bit encoded block or codeword is generated for every 8-bit data byte of data input. Proper operation of the Viterbi detector 16 requires a coding constraint of $Io \leq PM$, where Io represents the maximum number of adjacent zeroes within all-even or all-odd sequences and PM equals the interleaved length of the path memory for the Viterbi detector 16. Run length limited (RLL) constraints for the rate 8/9 block codes are identified using a (d,Go,Io,G1) notation. The d specifies the minimum number of adjacent zeroes and Go specifies the maximum number of adjacent zeroes or maximum run length of zeroes in the channel output code bit sequence. G1 specifies the maximum number of adjacent ones or maximum run length of ones in the channel output code bit sequence.

Two codes of the invention include run length limited constraints $(0,8,12,\infty)$ and $(0,8,6,\infty)$, respectively and each code maximizes the number of ones within all 256 9-bit codewords for the given Io constraint. TABLE I and TABLE II provide codeword assignment tables for the rate 8/9 $(0,8,12,\infty)$ and $(0,8,6,\infty)$ PRML modulation codes of the invention. Both rate 8/9 $(0,8,12,\infty)$ and $(0,8,6,\infty)$ codes maximizes the number of ones with each 9-bit codeword including at least 5 ones or in other words no more than 4 zeroes. For the rate 8/9 $(0,8,6,\infty)$ code, three having only 4 ones are substituted for codewords as follows in order to obtain the lower Io constraint:

| $(0, 8, 12, \infty)$ | → | $(0, 8, 6, \infty)$ |
|---|---|---|
| 010101011 | → | 000111100 |
| 110101010 | → | 001111000 |
| 101010101 | → | 001101100 |

Both rate 8/9 $(0,8,12,\infty)$ and $(0,8,6,\infty)$ codes have the property of read backward symmetry. Also both rate 8/9 $(0,8,12,\infty)$ and $(0,8,6,\infty)$ codes provide an all ones codeword corresponding to an all ones 8-bit data byte used for the sync pattern.

Figure 2:
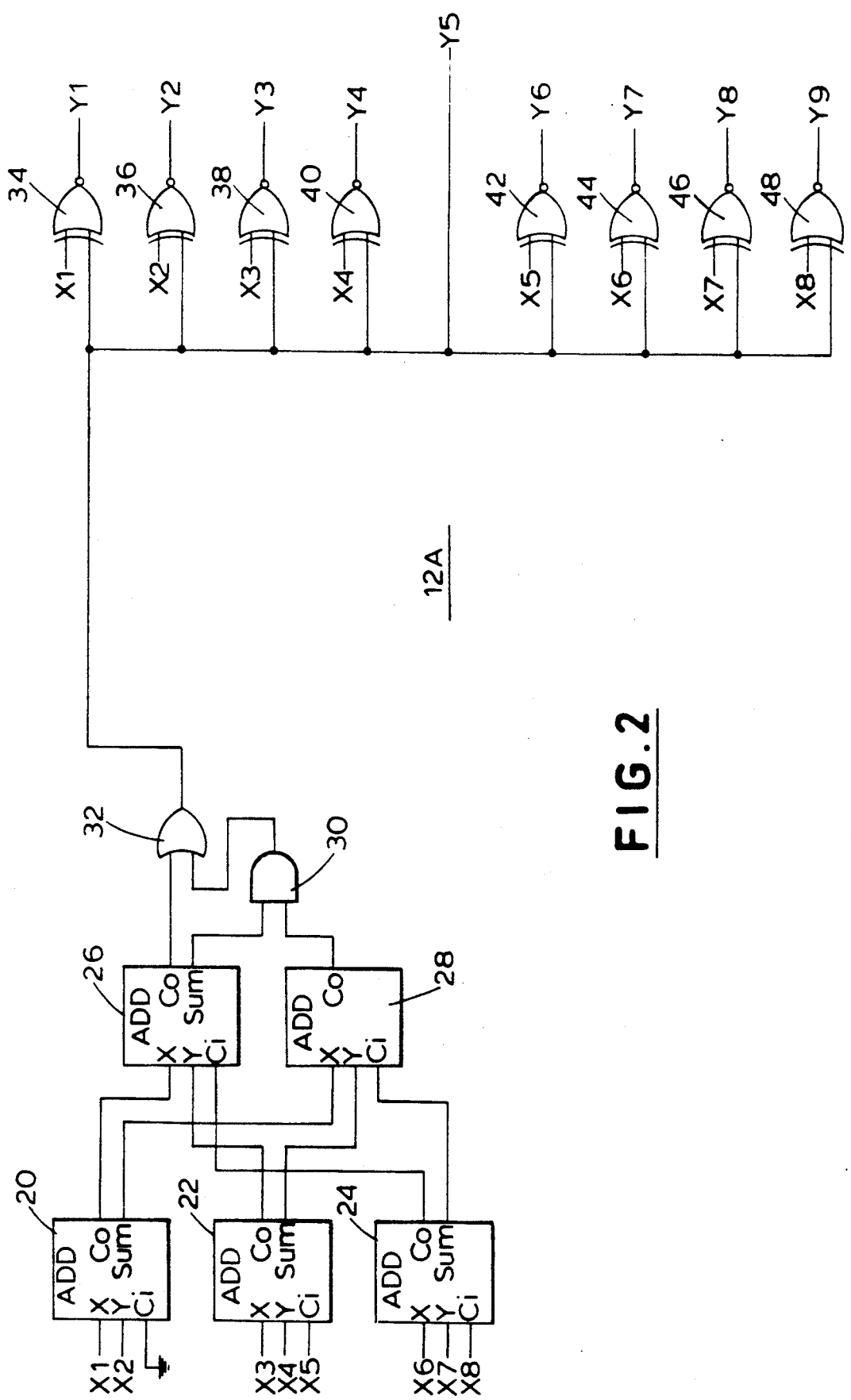
FIG. 2 is a schematic diagram representation of an encoder for a rate 8/9 $(0,8,12,\infty)$ code arranged in accordance with the invention.

Referring to FIG. 2, there is shown a schematic diagram representation of an encoder generally designated 12A for implementing the rate 8/9 $(0,8,12,\infty)$ code. Encoder 12A includes an 8-bit binary data byte input denoted X and assigned 9-bit codeword denoted Y, defined by:

$$X = X1, X2, X3, X4, X5, X6, X7, X8$$

$$Y = Y1, Y2, Y3, Y4, Y5, Y6, Y7, Y8, Y9$$

An intermediate variable denoted M is given by the following:

$$M = \begin{bmatrix} 0 \text{ if } \Sigma\ X1, X2, X3, X4, X5, X6, X7, X8 < 4 \\ 1 \text{ if } \Sigma\ X1, X2, X3, X4, X5, X6, X7, X8 \geq 4 \end{bmatrix}$$

An add the X1,X2,X3,X4,X5,X6,X7,X8 inputs and compare with 4 function is provided by full-adder blocks 20, 22, 24, 26, carry-generator 28, AND gate 30 and OR-gate 32 for providing the intermediate variable M. M is set equal to zero when the sum of the X1,X2,X3,X4,X5,X6,X7,X8 inputs is less than 4. Otherwise M is set equal to one when the sum is greater than or equal to 4. The codeword outputs Y1,Y2,Y3,Y4,Y5,Y6,Y7,Y8,Y9 are given by the following:

$$Y1 = X1 \oplus M$$
$$Y2 = X2 \oplus M$$
$$Y3 = X3 \oplus M$$
$$Y4 = X4 \oplus M$$
$$Y5 = M$$
$$Y6 = X5 \oplus M$$
$$Y7 = X6 \oplus M$$
$$Y8 = X7 \oplus M$$
$$Y9 = X8 \oplus M$$

The X1,X2,X3,X4,X5,X6,X7,X8 inputs and the intermediate variable M are received by a plurality of exclusive-nor (XNOR) gates 34, 36, 38, 40, 42, 44, 46 and 48 for providing the Y1,Y2,Y3,Y4,Y6,Y7,Y8,Y9 encoder outputs the intermediate variable M provides the Y5 encoder output.

Figure 3:
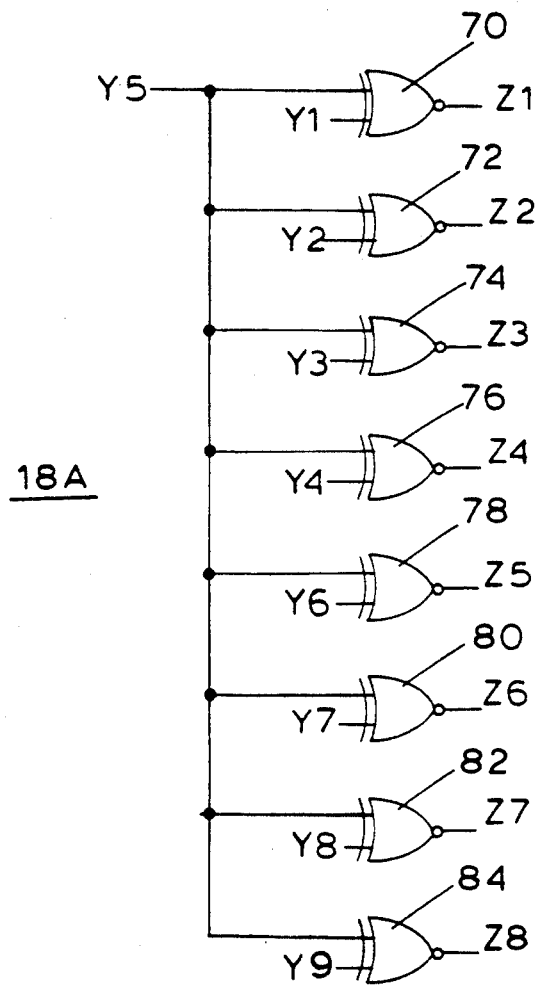
FIG. 3 is a schematic diagram representation of a decoder for a rate 8/9 $(0,8,12,\infty)$ code arranged in accordance with the invention.

FIG. 3 illustrates a decoder implementation for the rate 8/9 $(0,8,12, \infty)$ code generally designated 18A. Decoded data outputs, denoted Z, defined by:

$$Z = Z1, Z2, Z3, Z4, Z5, Z6, Z7, Z8$$

The decoded data outputs Z1,Z2,Z3,Z4,Z5,Z6,Z7,Z8 are given by the following:

$$Z1 = Y1 \oplus Y5$$
$$Z2 = Y2 \oplus Y5$$
$$Z3 = Y3 \oplus Y5$$
$$Z4 = Y4 \oplus Y5$$
$$Z5 = Y6 \oplus Y5$$
$$Z6 = Y8 \oplus Y5$$
$$Z7 = Y8 \oplus Y5$$
$$Z8 = Y8 \oplus Y5$$

The decoder inputs Y1,Y2,Y3,Y4,Y6,Y7,Y8,Y9 and the Y5 input are received by a plurality of exclusive-nor (XNOR) gates 70, 72, 74, 76, 78, 80, 82 and 84 for providing the decoder data outputs Z1,Z2,Z3,Z4,Z5,Z6,Z7,Z8.

Figure 4:
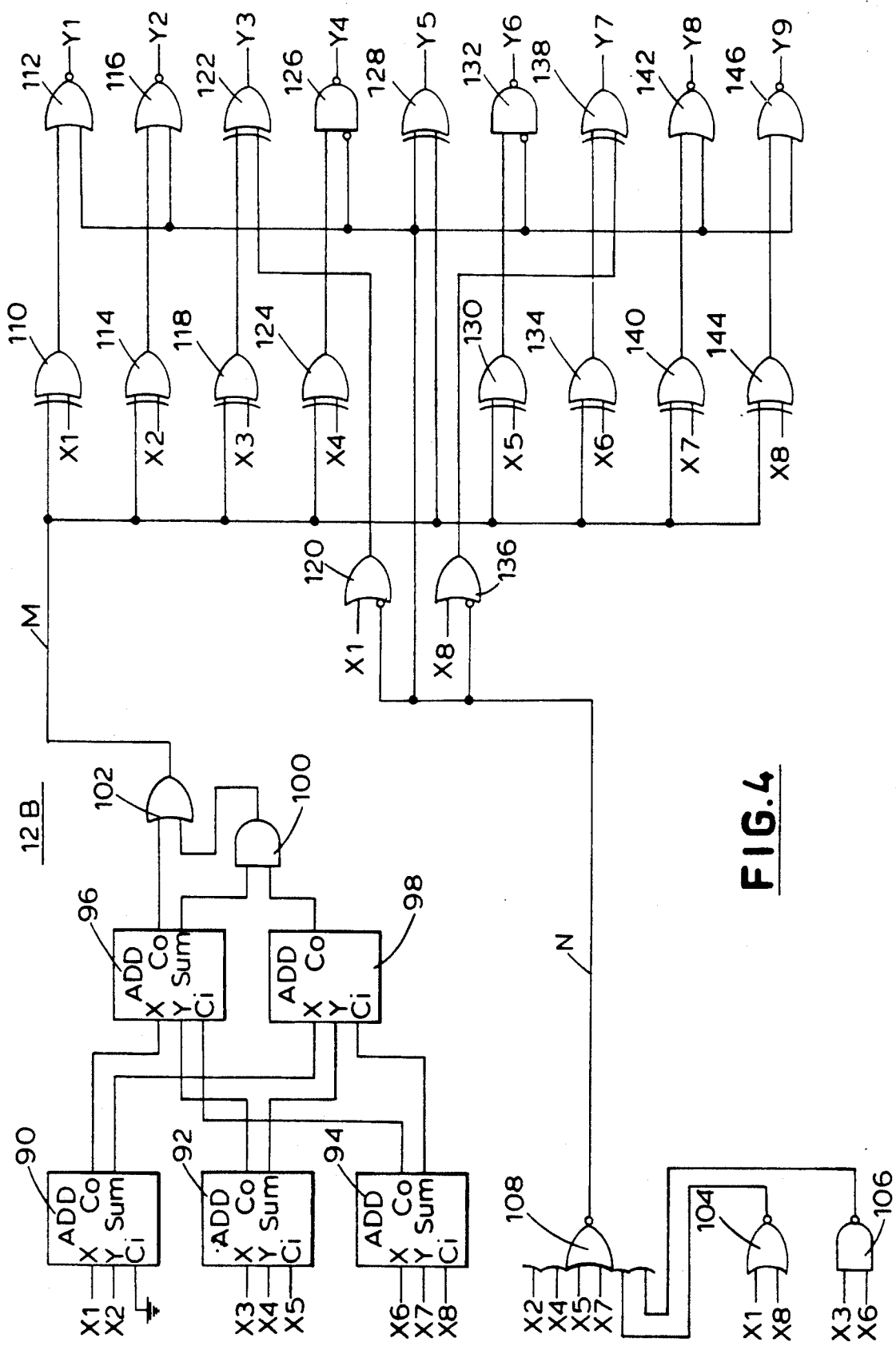
FIG. 4 is a schematic diagram representation of an encoder for a rate 8/9 $(0,8,6,\infty)$ code arranged in accordance with the invention.

Referring to FIG. 4, there is shown a schematic diagram representation of an encoder implementation generally designated 12B for the rate 8/9 $(0,8,6, \infty)$ code. Encoder 12B receives the 8-bit binary data byte input X and produces the intermediate variable M provided by gates 90, 92, 94, 96, 98, 100 and 102 An intermediate variable N is defined by:

$$N = (X1 + X8) + (X3 \cdot X6) + X2 + X4 + X5 + X7$$

The codeword outputs Y1,Y2,Y3,Y4,Y5,Y6,Y7,Y8,Y9 are given by the following structures:

$$Y1 = (X1 \oplus M) + N$$
$$Y2 = (X2 \oplus M) + N$$
$$Y3 = X3 \oplus M \oplus (X1 + N)$$

-continued
$$Y4 = (X4 \oplus M) \cdot N$$
$$Y5 = M \oplus N$$
$$Y6 = (X5 \oplus M) \cdot N$$
$$Y7 = X6 \oplus M \oplus (X8 + N)$$
$$Y8 = (X7 \oplus M) + N$$
$$Y9 = (X8 \oplus M) + N$$

The intermediate variable N is produced by a NOR gate 104 receiving the X1 and X8 inputs, a NAND gate 106 receiving the X3 and X6 inputs and a 6-wide NOR 108 receiving the outputs of gates 104 and 106 and the X2, X4, X5 and X7 data inputs. The Y1 codeword output is produced by a XOR gate 110 receiving the intermediate variable M and the X1 input and a NOR gate 112 receiving the intermediate variable M and the output of gate 110. The Y2 codeword output is produced by a XOR gate 114 receiving the intermediate variable M and the X2 input and a NOR gate 116 receiving the intermediate variable N and the output of gate 114. The Y3 codeword output is produced by a XOR gate 118 receiving the intermediate variable M and the X3 input, a NOR gate 120 receiving the X1 input and the intermediate variable N at an inverting input of gate 120 and an XOR gate 122 receiving the outputs of gate 118 and 120. The Y4 codeword output is produced by a XOR gate 124 receiving the intermediate variable M and the X4 input and a NAND gate 126 receiving the intermediate variable N at an inverting input of gate 126 and the output of gate 124. The Y5 codeword output is produced by a XOR gate 128 receiving the intermediate variables M and N. The Y6 codeword is produced by a XOR gate 130 receiving the intermediate variable M and the X5 input and a NAND gate 132 receiving the intermediate variable N at an inverting input and the output of gate 130. The Y7 codeword output is produced by a XOR gate 134 receiving the intermediate variable M and the X5 input, a NOR gate 136 receiving the X8 input and the intermediate variable N at an inverting input of gate 137 and an XOR gate 138 receiving the outputs of gate 134 and 136. The Y8 codeword output is produced by a XOR gate 140 receiving the intermediate variable M and the X7 input and a NOR gate 142 receiving the intermediate variable N and the output of gate 104. The Y9 codeword output is produced by a XOR gate 144 receiving the intermediate variable M and the X8 input and a NOR gate 146 receiving the intermediate variable N and the output of gate 144.

Figure 5:
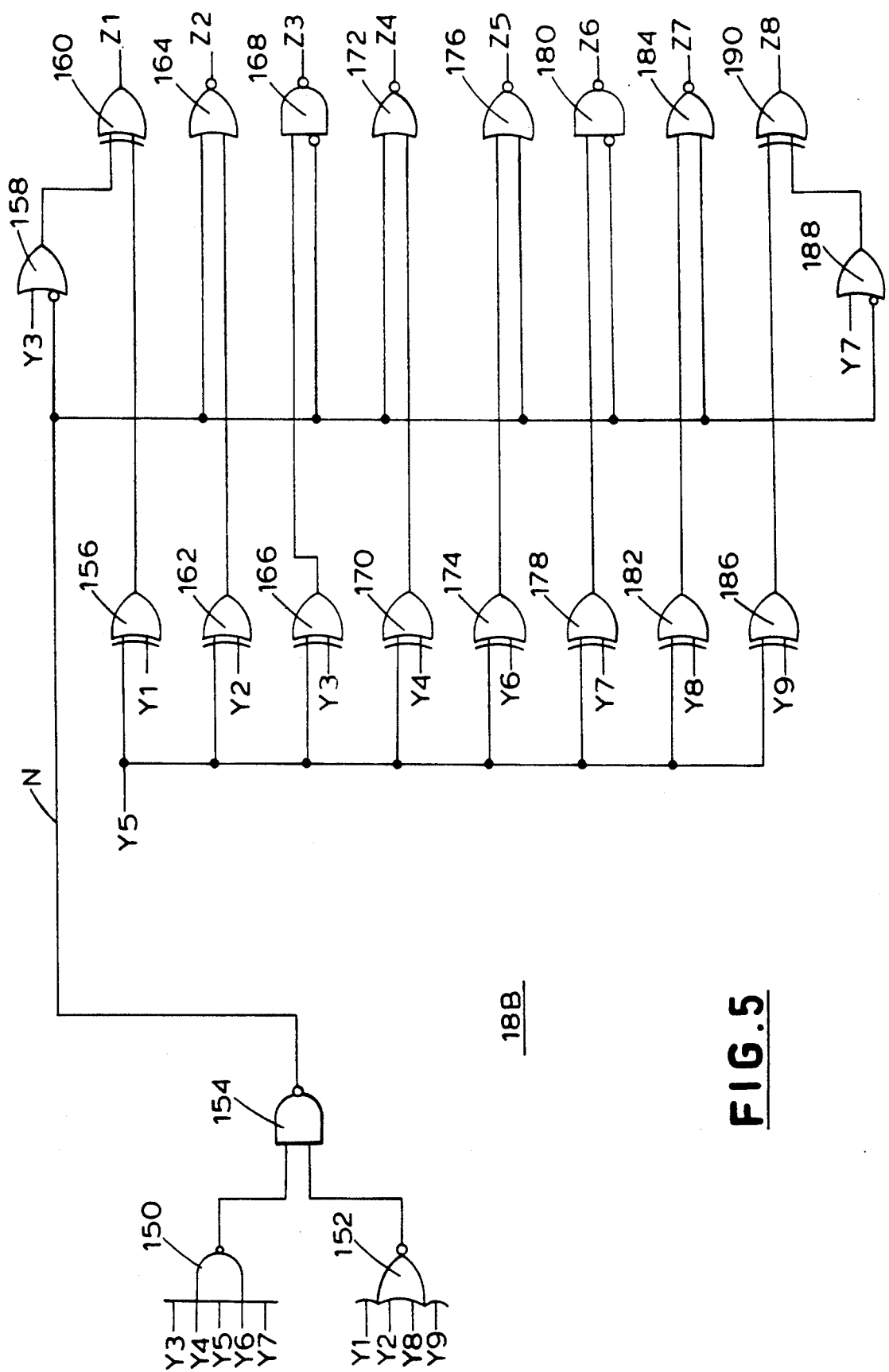
FIG. 5 is a schematic diagram representation of a decoder for a rate 8/9 $(0,8,6,\infty)$ code arranged in accordance with the invention.

FIG. 5 illustrates a decoder implementation for the rate 8/9 (0,8,6∞) code generally designated 18B. An intermediate value is given by the following:

$$N = (Y3 \cdot Y4 \cdot Y5 \cdot Y6 \cdot Yy) + Y1 + Y Y2 + Y8 + Y9)$$

The intermediate value N is produced by a 6-wide NAND 150 receiving the Y3, Y4, Y5, Y6 and Y7 inputs, a 4-wide NOR 152 receiving the Y1, Y2, Y8 and Y9 inputs and a NAND gate 154 receiving the outputs of gates 150 and 152. The decoded data outputs Z1,Z2,Z3,Z4,Z5,Z6,Z7,Z8 are given by the following:

$$Z1 = Y1 \oplus Y5 \oplus (Y3 + N)$$
$$Z2 = (Y2 \oplus Y5) + N$$
$$Z3 = (Y3 \oplus Y5) + N$$
$$Z4 = (Y4 \oplus Y5) + N$$
$$Z5 = (Y6 \oplus Y5) + N$$
$$Z6 = (Y7 \oplus Y5) \cdot N$$
$$Z7 = (Y8 \oplus Y5) + N$$
$$Z8 = Y9 \oplus Y5 \oplus (Y7 + N)$$

The Z1 decoder data output is provided by a XOR gate 156 receiving the Y1 and Y5 inputs, an OR gate 158 receiving the Y3 and inverted intermediate output N and a XOR gate 160 receiving the outputs of gates 156 and 158. The Z2 decoder data output is provided by a XOR gate 162 receiving the Y2 and Y5 inputs and a NOR gate 164 receiving the intermediate variable N and the output of gate 162. The Z3 decoder data output is provided by a XOR gate 166 receiving the Y3 and Y5 inputs and a NAND gate 168 receiving and inverting the intermediate variable N and the output of gate 166. Similarly, the Z4 and Z5 decoder data outputs are provided by XOR gates 170, 174 and NOR gates 172, 176, respectively. The Z6 decoder data output is provided by a XOR gate 178 receiving the Y7 and Y5 inputs and a NAND gate 180 receiving the inverted intermediate variable N and output of gate 180. The Z7 decoder data output is provided by a XOR gate 182 receiving the Y8 and Y5 inputs and a NOR gate 184 receiving the intermediate variable N and the output of gate 182. The Z8 decoder output is provided by a XOR gate 186 receiving the Y8 and Y5 inputs, an OR gate 188 receiving the Y7 and inverted intermediate output N and a XOR gate 190 receiving the outputs of gates 186 and 188.

FIG. 6 provides a chart illustrating power spectrums given a random input for the rate 8/9 (0,8,12,∞) and rate 8/9 (0,8,6,∞) PRML modulation codes of the invention relative to a known rate 8/9 (4,4,10) code and uncoded data. As shown, the rate 8/9 (0,8,12,∞) and rate 8/9 (0,8,6,∞) PRML modulation codes of the invention produce greater power in the center of the channel bandwidth and less power at the bandwidth edges relative to known codes. This power spectrum decreases the codes susceptibility to misequalization which occurs dominantly at the bandwidth edges.

TABLE I

| RATE 8/9 (0, 8, 12, ∞) CODEWORDS | | | | | | | |
|---|---|---|---|---|---|---|---|
| INPUT | OUTPUT | INPUT | OUTPUT | INPUT | OUTPUT | INPUT | OUTPUT |
| 00000000 | 111101111 | 01000000 | 101101111 | 10000000 | 011101111 | 11000000 | 001101111 |
| 00000001 | 111101110 | 01000001 | 101101110 | 10000001 | 011101110 | 11000001 | 001101110 |
| 00000010 | 111101101 | 01000010 | 101101101 | 10000010 | 011101101 | 11000010 | 001101101 |
| 00000011 | 111101100 | 01000011 | 101101100 | 10000011 | 011101100 | 11000011 | 110010011 |
| 00000100 | 111101011 | 01000100 | 101101011 | 10000100 | 011101011 | 11000100 | 001101011 |
| 00000101 | 111101010 | 01000101 | 101101010 | 10000101 | 011101010 | 11000101 | 110010101 |
| 00000110 | 111101001 | 01000110 | 101101001 | 10000110 | 011101001 | 11000110 | 110010110 |
| 00000111 | 111101000 | 01000111 | 010010111 | 10000111 | 100010111 | 11000111 | 110010111 |
| 00001000 | 111100111 | 01001000 | 101100111 | 10001000 | 011100111 | 11001000 | 001100111 |
| 00001001 | 111100110 | 01001001 | 101100110 | 10001001 | 011100110 | 11001001 | 110011001 |
| 00001010 | 111100101 | 01001010 | 101100101 | 10001010 | 011100101 | 11001010 | 110011010 |
| 00001011 | 111100100 | 01001011 | 010011011 | 10001011 | 100011011 | 11001011 | 110011011 |
| 00001100 | 111100011 | 01001100 | 101100011 | 10001100 | 011100011 | 11001100 | 110011100 |
| 00001101 | 111100010 | 01001101 | 010011101 | 10001101 | 100011101 | 11001101 | 110011101 |

TABLE I-continued

RATE 8/9 (0, 8, 12, ∞) CODEWORDS

| INPUT | OUTPUT | INPUT | OUTPUT | INPUT | OUTPUT | INPUT | OUTPUT |
|---|---|---|---|---|---|---|---|
| 00001110 | 111100001 | 01001110 | 010011110 | 10001110 | 100011110 | 11001110 | 110011110 |
| 00001111 | 000011111 | 01001111 | 010011111 | 10001111 | 100011111 | 11001111 | 110011111 |
| 00010000 | 111001111 | 01010000 | 101001111 | 10010000 | 011001111 | 11010000 | 001001111 |
| 00010001 | 111001110 | 01010001 | 101001110 | 10010001 | 011001110 | 11010001 | 110110001 |
| 00010010 | 111001101 | 01010010 | 101001101 | 10010010 | 011001101 | 11010010 | 110110010 |
| 00010011 | 111001100 | 01010011 | 010110011 | 10010011 | 100110011 | 11010011 | 110110011 |
| 00010100 | 111001011 | 01010100 | 101001011 | 10010100 | 011001011 | 11010100 | 110110100 |
| 00010101 | 111001010 | 01010101 | 010110101 | 10010101 | 100110101 | 11010101 | 110110101 |
| 00010110 | 111001001 | 01010110 | 010110110 | 10010110 | 100110110 | 11010110 | 110110110 |
| 00010111 | 000110111 | 01010111 | 010110111 | 10010111 | 100110111 | 11010111 | 110110111 |
| 00011000 | 111000111 | 01011000 | 101000111 | 10011000 | 011000111 | 11011000 | 110111000 |
| 00011001 | 111000110 | 01011001 | 010111001 | 10011001 | 100111001 | 11011001 | 110111001 |
| 00011010 | 111000101 | 01011010 | 010111010 | 10011010 | 100111010 | 11011010 | 110111010 |
| 00011011 | 000111011 | 01011011 | 010111011 | 10011011 | 100111011 | 11011011 | 110111011 |
| 00011100 | 111000011 | 01011100 | 010111100 | 10011100 | 100111100 | 11011100 | 110111100 |
| 00011101 | 000111101 | 01011101 | 010111101 | 10011101 | 100111101 | 11011101 | 110111101 |
| 00011110 | 000111110 | 01011110 | 010111110 | 10011110 | 100111110 | 11011110 | 110111110 |
| 00011111 | 000111111 | 01011111 | 010111111 | 10011111 | 100111111 | 11011111 | 110111111 |
| 00100000 | 110101111 | 01100000 | 100101111 | 10100000 | 010101111 | 11100000 | 000101111 |
| 00100001 | 110101110 | 01100001 | 100101110 | 10100001 | 010101110 | 11100001 | 111010001 |
| 00100010 | 110101101 | 01100010 | 100101101 | 10100010 | 010101101 | 11100010 | 111010010 |
| 00100011 | 110101100 | 01100011 | 011010011 | 10100011 | 101010011 | 11100011 | 111010011 |
| 00100100 | 110101011 | 01100100 | 100101011 | 10100100 | 010101011 | 11100100 | 111010100 |
| 00100101 | 110101010 | 01100101 | 011010101 | 10100101 | 101010101 | 11100101 | 111010101 |
| 00100110 | 110101001 | 01100110 | 011010110 | 10100110 | 101010110 | 11100110 | 111010110 |
| 00100111 | 001010111 | 01100111 | 011010111 | 10100111 | 101010111 | 11100111 | 111010111 |
| 00101000 | 110100111 | 01101000 | 100100111 | 10101000 | 010100111 | 11101000 | 111011000 |
| 00101001 | 110100110 | 01101001 | 011011001 | 10101001 | 101011001 | 11101001 | 111011001 |
| 00101010 | 110100101 | 01101010 | 011011010 | 10101010 | 101011010 | 11101010 | 111011010 |
| 00101011 | 001011011 | 01101011 | 011011011 | 10101011 | 101011011 | 11101011 | 111011011 |
| 00101100 | 110100011 | 01101100 | 011011100 | 10101100 | 101011100 | 11101100 | 111011100 |
| 00101101 | 001011101 | 01101101 | 011011101 | 10101101 | 101011101 | 11101101 | 111011101 |
| 00101110 | 001011110 | 01101110 | 011011110 | 10101110 | 101011110 | 11101110 | 111011110 |
| 00101111 | 001011111 | 01101111 | 011011111 | 10101111 | 101011111 | 11101111 | 111011111 |
| 00110000 | 110001111 | 01110000 | 100001111 | 10110000 | 010001111 | 11110000 | 111110000 |
| 00110001 | 110001110 | 01110001 | 011110001 | 10110001 | 101110001 | 11110001 | 111110001 |
| 00110010 | 110001101 | 01110010 | 011110010 | 10110010 | 101110010 | 11110010 | 111110010 |
| 00110011 | 001110011 | 01110011 | 011110011 | 10110011 | 101110011 | 11110011 | 111110011 |
| 00110100 | 110001011 | 01110100 | 011110100 | 10110100 | 101110100 | 11110100 | 111110100 |
| 00110101 | 001110101 | 01110101 | 011110101 | 10110101 | 101110101 | 11110101 | 111110101 |
| 00110110 | 001110110 | 01110110 | 011110110 | 10110110 | 101110110 | 11110110 | 111110110 |
| 00110111 | 001110111 | 01110111 | 011110111 | 10110111 | 101110111 | 11110111 | 111110111 |
| 00111000 | 110000111 | 01111000 | 011111000 | 10111000 | 101111000 | 11111000 | 111111000 |
| 00111001 | 001111001 | 01111001 | 011111001 | 10111001 | 101111001 | 11111001 | 111111001 |
| 00111010 | 001111010 | 01111010 | 011111010 | 10111010 | 101111010 | 11111010 | 111111010 |
| 00111011 | 001111011 | 01111011 | 011111011 | 10111011 | 101111011 | 11111011 | 111111011 |
| 00111100 | 001111100 | 01111100 | 011111100 | 10111100 | 101111100 | 11111100 | 111111100 |
| 00111101 | 001111101 | 01111101 | 011111101 | 10111101 | 101111101 | 11111101 | 111111101 |
| 00111110 | 001111110 | 01111110 | 011111110 | 10111110 | 101111110 | 11111110 | 111111110 |
| 00111111 | 001111111 | 01111111 | 011111111 | 10111111 | 101111111 | 11111111 | 111111111 |

TABLE II

RATE 8/9 (0, 8, 6, ∞) CODEWORDS

| INPUT | OUTPUT | INPUT | OUTPUT | INPUT | OUTPUT | INPUT | OUTPUT |
|---|---|---|---|---|---|---|---|
| 00000000 | 111101111 | 01000000 | 101101111 | 10000000 | 011101111 | 11000000 | 001101111 |
| 00000001 | 111101110 | 01000001 | 101101110 | 10000001 | 011101110 | 11000001 | 001101110 |
| 00000010 | 111101101 | 01000010 | 101101101 | 10000010 | 011101101 | 11000010 | 001101101 |
| 00000011 | 111101100 | 01000011 | 101101100 | 10000011 | 011101100 | 11000011 | 110010011 |
| 00000100 | 111101011 | 01000100 | 101101011 | 10000100 | 011101011 | 11000100 | 001101011 |
| 00000101 | 111101010 | 01000101 | 101101010 | 10000101 | 011101010 | 11000101 | 110010101 |
| 00000110 | 111101001 | 01000110 | 101101001 | 10000110 | 011101001 | 11000110 | 110010110 |
| 00000111 | 111101000 | 01000111 | 010010111 | 10000111 | 100010111 | 11000111 | 110010111 |
| 00001000 | 111100111 | 01001000 | 101100111 | 10001000 | 011100111 | 11001000 | 001100111 |
| 00001001 | 111100110 | 01001001 | 101100110 | 10001001 | 011100110 | 11001001 | 110011001 |
| 00001010 | 111100101 | 01001010 | 101100101 | 10001010 | 011100101 | 11001010 | 110011010 |
| 00001011 | 111100100 | 01001011 | 010011011 | 10001011 | 100011011 | 11001011 | 110011011 |
| 00001100 | 111100011 | 01001100 | 101100011 | 10001100 | 011100011 | 11001100 | 110011100 |
| 00001101 | 111100010 | 01001101 | 010011101 | 10001101 | 100011101 | 11001101 | 110011101 |
| 00001110 | 111100001 | 01001110 | 010011110 | 10001110 | 100011110 | 11001110 | 110011110 |
| 00001111 | 000011111 | 01001111 | 010011111 | 10001111 | 100011111 | 11001111 | 110011111 |
| 00010000 | 111001111 | 01010000 | 101001111 | 10010000 | 011001111 | 11010000 | 001001111 |
| 00010001 | 111001110 | 01010001 | 101001110 | 10010001 | 011001110 | 11010001 | 110110001 |
| 00010010 | 111001101 | 01010010 | 101001101 | 10010010 | 011001101 | 11010010 | 110110010 |
| 00010011 | 111001100 | 01010011 | 010110011 | 10010011 | 100110011 | 11010011 | 110110011 |
| 00010100 | 111001011 | 01010100 | 101001011 | 10010100 | 011001011 | 11010100 | 110110100 |
| 00010101 | 111001010 | 01010101 | 010110101 | 10010101 | 100110101 | 11010101 | 110110101 |
| 00010110 | 111001001 | 01010110 | 010110110 | 10010110 | 100110110 | 11010110 | 110110110 |

TABLE iI-continued

| RATE 8/9 (0, 8, 6, ∞) CODEWORDS | | | | | | | |
|---|---|---|---|---|---|---|---|
| INPUT | OUTPUT | INPUT | OUTPUT | INPUT | OUTPUT | INPUT | OUTPUT |
| 00010111 | 000110111 | 01010111 | 010110111 | 10010111 | 100110111 | 11010111 | 110110111 |
| 00011000 | 111000111 | 01011000 | 101000111 | 10011000 | 011000111 | 11011000 | 110111000 |
| 00011001 | 111000110 | 01011001 | 010111001 | 10011001 | 100111001 | 11011001 | 110111001 |
| 00011010 | 111000101 | 01011010 | 010111010 | 10011010 | 100111010 | 11011010 | 110111010 |
| 00011011 | 000111011 | 01011011 | 010111011 | 10011011 | 100111011 | 11011011 | 110111011 |
| 00011100 | 111000011 | 01011100 | 010111100 | 10011100 | 100111100 | 11011100 | 110111100 |
| 00011101 | 000111101 | 01011101 | 010111101 | 10011101 | 100111101 | 11011101 | 110111101 |
| 00011110 | 000111110 | 01011110 | 010111110 | 10011110 | 100111110 | 11011110 | 110111110 |
| 00011111 | 000111111 | 01011111 | 010111111 | 10011111 | 100111111 | 11011111 | 110111111 |
| 00100000 | 110101111 | 01100000 | 100101111 | 10100000 | 010101111 | 11100000 | 000101111 |
| 00100001 | 110101110 | 01100001 | 100101110 | 10100001 | 010101110 | 11100001 | 111010001 |
| 00100010 | 110101101 | 01100010 | 100101101 | 10100010 | 010101101 | 11100010 | 111010010 |
| 00100011 | 110101100 | 01100011 | 011010011 | 10100011 | 101010011 | 11100011 | 111010011 |
| 00100100 | 110101011 | 01100100 | 100101011 | 10100100 | 010101011 | 11100100 | 111010100 |
| 00100101 | 110101010 | 01100101 | 011010101 | 10100101 | 101010101 | 11100101 | 111010101 |
| 00100110 | 110101001 | 01100110 | 011010110 | 10100110 | 101010110 | 11100110 | 111010110 |
| 00100111 | 001010111 | 01100111 | 011010111 | 10100111 | 101010111 | 11100111 | 111010111 |
| 00101000 | 110100111 | 01101000 | 100100111 | 10101000 | 010100111 | 11101000 | 111011000 |
| 00101001 | 110100110 | 01101001 | 011011001 | 10101001 | 101011001 | 11101001 | 111011001 |
| 00101010 | 110100101 | 01101010 | 011011010 | 10101010 | 101011010 | 11101010 | 111011010 |
| 00101011 | 001011011 | 01101011 | 011011011 | 10101011 | 101011011 | 11101011 | 111011011 |
| 00101100 | 110100011 | 01101100 | 011011100 | 10101100 | 101011100 | 11101100 | 111011100 |
| 00101101 | 001011101 | 01101101 | 011011101 | 10101101 | 101011101 | 11101101 | 111011101 |
| 00101110 | 001011110 | 01101110 | 011011110 | 10101110 | 101011110 | 11101110 | 111011110 |
| 00101111 | 001011111 | 01101111 | 011011111 | 10101111 | 101011111 | 11101111 | 111011111 |
| 00110000 | 110001111 | 01110000 | 100001111 | 10110000 | 010001111 | 11110000 | 111110000 |
| 00110001 | 110001110 | 01110001 | 011110001 | 10110001 | 101110001 | 11110001 | 111110001 |
| 00110010 | 110001101 | 01110010 | 011110010 | 10110010 | 101110010 | 11110010 | 111110010 |
| 00110011 | 001110011 | 01110011 | 011110011 | 10110011 | 101110011 | 11110011 | 111110011 |
| 00110100 | 110001011 | 01110100 | 011110100 | 10110100 | 101110100 | 11110100 | 111110100 |
| 00110101 | 001110101 | 01110101 | 011110101 | 10110101 | 101110101 | 11110101 | 111110101 |
| 00110110 | 001110110 | 01110110 | 011110110 | 10110110 | 101110110 | 11110110 | 111110110 |
| 00110111 | 001110111 | 01110111 | 011110111 | 10110111 | 101110111 | 11110111 | 111110111 |
| 00111000 | 110000111 | 01111000 | 011111000 | 10111000 | 101111000 | 11111000 | 111111000 |
| 00111001 | 001111001 | 01111001 | 011111001 | 10111001 | 101111001 | 11111001 | 111111001 |
| 00111010 | 001111010 | 01111010 | 011111010 | 10111010 | 101111010 | 11111010 | 111111010 |
| 00111011 | 001111011 | 01111011 | 011111011 | 10111011 | 101111011 | 11111011 | 111111011 |
| 00111100 | 001111100 | 01111100 | 011111100 | 10111100 | 101111100 | 11111100 | 111111100 |
| 00111101 | 001111101 | 01111101 | 011111101 | 10111101 | 101111101 | 11111101 | 111111101 |
| 00111110 | 001111110 | 01111110 | 011111110 | 10111110 | 101111110 | 11111110 | 111111110 |
| 00111111 | 001111111 | 01111111 | 011111111 | 10111111 | 101111111 | 11111111 | 111111111 |

What is claimed and desired to be secured by Letters Patent of the United States is:

1. A method for encoding a predefined number of bits of binary data into codewords having a predefined number of bits for a partial-response maximum-likelihood (PRML) data channel in a direct access storage device (DASD) comprising the steps of:
   receiving the binary data; and
   generating sequences of codewords responsive to the received binary data;
   each of said generated codewords being included within a predetermined set of codewords, said codeword set having a maximum number of binary ones;
   said generated sequences of codewords having less than a first predetermined number of consecutive zeros;
   said generated sequences of codewords including two subsequences, one of said subsequences including odd bit positions and another of said subsequences including even bit positions, said subsequences having less than a second predetermined number of consecutive zeros.

2. A method as recited in claim 1 wherein 8-bits of binary data are encoded into 9-bit codewords and said predetermined set of codewords includes 256 codewords and at least 253 codewords have at least 5 ones and wherein said step of generating sequences of codewords includes the steps of:
   calculating the sum of said 8-bits of binary data;
   comparing the calculated sum with 4;
   defining an intermediate variable responsive to said compared values.

3. A method as recited in claim 2 further includes the steps of:
   defining the intermediate variable equal to zero responsive to the calculated sum less than 4;
   defining the intermediate variable equal to one responsive to the calculated sum greater than or equal to 4.

4. A method as recited in claim 3 wherein said first predetermined number equals 8 and wherein said second predetermined number equals 12 and further includes the steps of:
   combining the defined intermediate variable and each of said 8-bits by an exclusive nor operation to define 8 of the 9-bit codeword; and
   defining another codeword bit equal to the defined intermediate variable.

5. A method as recited in claim 3 wherein said first predetermined number equals 8 and wherein said second predetermined number equals 6 and further includes the steps of:
   defining a second intermediate variable as a function of said 8-bits of binary data;
   combining the defined intermediate variable and each of said 8-bits by an exclusive or operation; defining 8 of the 9-bit codeword as a function of said combined bits and said second intermediate variable; and combining the defined intermediate variable and the second intermediate variable by an exclusive or operation to define another codeword bit.

6. A method as recited in claim 1 wherein said generated sequences of codewords provide greater power density in the center of the PRML channel bandwidth and less power at the bandwidth edges whereby susceptibility to misequalization is reduced.

7. Apparatus for encoding a predefined number of bits of binary data into codewords having a predefined number of bits for a partial-response maximum-likelihood (PRML) data channel in a direct access storage device (DASD) comprising:

means for receiving the binary data; and means coupled to said receiving means for generating sequences of codewords responsive to the received binary data;

each of said generated codewords being includes within a predetermined set of codewords, said codeword set having a maximum number of binary ones;

said generated sequences of codewords having less than a first predetermined number of consecutive zeroes;

said generated sequences of codewords including two subsequences, one of said subsequences including odd bit positions and another of said subsequences including even bit positions, said subsequences having less than a second predetermined number of consecutive zeroes.

8. Apparatus as recited claim 7 wherein 8-bits of binary data are encoded into 9-bit codewords and wherein said means for generating sequences of codewords includes means for defining an intermediate variable equal to either one or zero responsive to each received 8-bits of binary data.

9. Apparatus as recited claim 8 wherein said first predetermined number equals 8 and wherein said second predetermined number equals 12 and further includes:

means for combining the defined intermediate variable and each of said 8-bits by an exclusive nor operation to define 8 of the 9-bit codeword; and means for defining another codeword bit equal to the defined intermediate variable.

10. Apparatus as recited claim 8 wherein said first predetermined number equals 8 and wherein said second predetermined number equals 6 and further includes:

means for defining a second intermediate variable as a function of said 8-bits of binary data;

means for combining the defined intermediate variable and each of said 8-bits by an exclusive or operation;

means for defining 8 of the 9-bit codeword as a function of said combined bits and said second intermediate variable; and means for combining the defined intermediate variable and the second intermediate variable by an exclusive or operation to define another codeword bit.

11. Apparatus as recited claim 9 further includes decoder means for decoding said generated sequences of codewords.

12. Apparatus as recited claim 11 wherein said decoder means includes means for combining each of the defined 8 of the 9-bit codeword with said other codeword bit by an exclusive nor operation to produce the binary data.

13. Apparatus as recited claim 10 further includes decoder means for decoding said generated sequences of codewords.

14. Apparatus as recited claim 13 wherein said decoder means includes means for combining each of the defined 8 of the 9-bit codeword with said other codeword bit by an exclusive nor operation and means for combining said combined bits with said second intermediate value to produce the binary data.

15. Apparatus as recited claim 8 wherein said first predetermined number equals 8 and wherein said second predetermined number equals 12 and wherein said encoding apparatus includes a plurality of gating means for producing the codewords.

16. Apparatus as recited claim 8 wherein said first predetermined number equals 8 and wherein said second predetermined number equals 6 and wherein said encoding apparatus includes a plurality of gating means for producing the codewords.

* * * * *

UNITED STATES PATENT AND TRADEMARK OFFICE
CERTIFICATE OF CORRECTION

PATENT NO. : 5,196,849

DATED : March 23, 1993

INVENTOR(S) : Richard L. Galbraith

It is certified that error appears in the above-identified patent and that said Letters Patent is hereby corrected as shown below:

Column 2, line 19, before "have", insert --codewords--;

Column 4, lines 16-24, replace equations Y1-Y9 with the following:

$$Y1 = \overline{X1 \oplus M}$$
$$Y2 = \overline{X2 \oplus M}$$
$$Y3 = \overline{X3 \oplus M}$$
$$Y4 = \overline{X4 \oplus M}$$
$$Y5 = M$$
$$Y6 = \overline{X5 \oplus M}$$
$$Y7 = \overline{X6 \oplus M}$$
$$Y8 = \overline{X7 \oplus M}$$
$$Y9 = \overline{X8 \oplus M}$$

Column 4, lines 40-46, replace equations Z1-Z8 with the following:

$$Z1 = \overline{Y1 \oplus Y5}$$
$$Z2 = \overline{Y2 \oplus Y5}$$
$$Z3 = \overline{Y3 \oplus Y5}$$
$$Z4 = \overline{Y4 \oplus Y5}$$
$$Z5 = \overline{Y6 \oplus Y5}$$
$$Z6 = \overline{Y7 \oplus Y5}$$
$$Z7 = \overline{Y8 \oplus Y5}$$
$$Z8 = \overline{Y8 \oplus Y5}$$

Column 4, line 61, replace the equation N with the following:

$$N = \overline{(\overline{X1} + \overline{X8}) + (\overline{X3} \cdot \overline{X6}) + X2 + X4 + X5 + X7}$$

UNITED STATES PATENT AND TRADEMARK OFFICE
CERTIFICATE OF CORRECTION

PATENT NO. : 5,196,849

DATED : March 23, 1993

INVENTOR(S) : Richard L. Galbraith

It is certified that error appears in the above-identified patent and that said Letters Patent is hereby corrected as shown below:

Column 4, lines 66-69, replace equations Y1-Y3 with the following:

$$Y1 = \overline{(X1 \oplus M) + N}$$
$$Y2 = (\overline{X2 \oplus M}) + N$$
$$Y3 = X3 \oplus M \oplus (X1 + \overline{N})$$

Column 5, lines 2-7, replace equations Y4-Y9 with the following:

$$Y4 = \overline{(X4 \oplus M)} \cdot \overline{\overline{N}}$$
$$Y5 = M \oplus N$$
$$Y6 = \overline{(X5 \oplus M)} \cdot \overline{\overline{N}}$$
$$Y7 = X6 \oplus M \oplus (X8 + \overline{N})$$
$$Y8 = \overline{(X7 \oplus M) + N}$$
$$Y9 = \overline{(X8 \oplus M) + N}$$

Column 6, line 1, replace equation N with the following:

$$N = \overline{((Y3 \cdot Y4 \cdot Y5 \cdot Y6 \cdot Y7) + Y1 + Y2 + Y8 + Y9)}$$

Column 6, lines 11-17, replace equations Z1-Z8 with the following:

$$Z1 = Y1 \oplus Y5 \oplus (Y3 + \overline{N})$$
$$Z2 = \overline{(Y2 \oplus Y5) + N}$$
$$Z3 = \overline{(Y3 \oplus Y5) + \overline{N}}$$
$$Z4 = \overline{(Y4 \oplus Y5) + N}$$
$$Z5 = \overline{(Y6 \oplus Y5) + N}$$
$$Z6 = \overline{(Y7 \oplus Y5)} \cdot \overline{N}$$
$$Z7 = \overline{(Y8 \oplus Y5) + N}$$
$$Z8 = Y9 \oplus Y5 \oplus (Y7 + \overline{N})$$

UNITED STATES PATENT AND TRADEMARK OFFICE
CERTIFICATE OF CORRECTION

PATENT NO. : 5,196,849

DATED : March 23, 1993

INVENTOR(S) : Richard L. Galbraith

It is certified that error appears in the above-identified patent and that said Letters Patent is hereby corrected as shown below:

Columns 7 and 8, directly above the second table, replace "iI" with --II--;

Columns 9 and 10, line 1, replace "iI" with --II--;

Column 9, line 56, replace "zeros" with --zeroes--;

Column 9, line 62, replace "zeros" with --zeroes--;

Column 10, line 67, "defining" should begin a new paragraph;

Column 11, line 21, replace "includes" with --included--;

Column 11, line 34, after "recited", insert --in--;

Column 11, line 40, after "recited", insert --in--;

Column 12, line 3, after "recited", insert --in--;

Column 12, line 19, after "recited", insert --in--;

Column 12, line 22, after "recited", insert --in--;

Column 12, line 27, after "recited", insert --in--;

Column 12, line 30, after "recited", insert --in--;

Column 12, line 36, after "recited", insert --in--; and

UNITED STATES PATENT AND TRADEMARK OFFICE
CERTIFICATE OF CORRECTION

PATENT NO. : 5,196,849
DATED : March 23, 1993
INVENTOR(S) : Richard L. Galbraith It is certified that error appears in the above-indentified patent and that said Letters Patent is hereby corrected as shown below:

Column 12, line 41, after "recited", insert --in--.

Signed and Sealed this

Fourth Day of January, 1994

Attest:

BRUCE LEHMAN

Attesting Officer     Commissioner of Patents and Trademarks